United States Patent [19]

Hassan et al.

[11] 4,081,201

[45] Mar. 28, 1978

[54] WAFER AIR FILM TRANSPORTATION SYSTEM

[75] Inventors: Javathu Kutikaran Hassan, Hopewell Junction; John Angelo Paivanas, Hyde Park, both of N.Y.

[73] Assignee: International Business Machines Corporation, Armonk, N.Y.

[21] Appl. No.: 754,306

[22] Filed: Dec. 27, 1976

[51] Int. Cl.² ............................................. B65G 51/02
[52] U.S. Cl. ..................................... 302/2 R; 302/31
[58] Field of Search ........................... 302/2 R, 29, 31; 214/1 BE; 104/23 FS; 226/97

[56] References Cited

U.S. PATENT DOCUMENTS

| 3,231,165 | 1/1966 | Wallin et al. | 226/97 |
| 3,272,415 | 9/1966 | Wallin | 226/97 |
| 3,385,490 | 5/1968 | Malmgren et al. | 302/29 X |
| 3,873,013 | 3/1975 | Stibbe | 226/97 |
| 3,918,706 | 11/1975 | Craft | 302/31 X |
| 3,982,328 | 9/1976 | Gustafsson et al. | 226/97 X |

FOREIGN PATENT DOCUMENTS 1,216,123  12/1970  United Kingdom ................... 226/97

OTHER PUBLICATIONS

IBM Technical Disclosure Bulletin, "Self-Centering Air Lift Transport," Apgar; D.H., and Ku; T.C., vol. 18, No. 7, Dec., 1975.

Primary Examiner—Bruce H. Stoner, Jr.
Assistant Examiner—James L. Rowland
Attorney, Agent, or Firm—James E. Murray

[57] ABSTRACT

The transportation of semiconductor wafers along a track on an air film. The supporting air film is controlled by the track configuration and fluid relationships to eliminate the need of a wafer guide on restraint to keep the wafers on the track.

9 Claims, 12 Drawing Figures

4,081,201

WAFER AIR FILM TRANSPORTATION SYSTEM

BACKGROUND OF THE INVENTION

The present invention relates to the transportation of objects such as semiconductor wafers along a track on an air film and more particularly to the minimization of movements of the objects in any direction but the desired direction of transportation.

For some time now objects such as semiconductor wafers have been moved along a track on an air film during manufacturing and testing processes. In the past, the forces exerted by the air film on the wafers has resulted in the wafers contacting with dust or environment control shields covering the track or with the guides placed along the track to constrain the motion of the wafers. This has resulted in damage to the wafers lowering the yield rate of the semiconductor circuits on the wafers. Therefore it is desirable that the need for such guides to correct the motion of the wafers be eliminated or reduced.

The transportation of a wafer on a supporting air film, without boundary guides is difficult because low sliding friction and momentum of the moving wafer causes the wafer to diverge from the desired direction of transportation. A system having such a wafer handling capability must have an air film "structure" with unique control properties. Namely, it must be able to constrain the wafer motion in various directions while allowing controlled motion in a desired direction and manner. Furthermore, these control characteristics must be inherently stable and thus resistive to extraneous effects which could cause motion instabilities.

Ideally, this system also features simple and low cost construction; ease in installation and maintainability; low air consumption; performance insensitivity to clean air enclosures; clean operating environment; and, high overall reliability.

THE INVENTION

Therefore in accordance with the present invention, the supporting air film characteristics are controlled to reduce movement of the wafers in all but the desired direction of transportation. To this end an axi-radial effect and a Coanda effect are generated by a track surface construction containing rows of long air feed nozzles separated by evacuating channels. The air passages of the nozzles are at least four times as long as they are in diameter and terminate in flat regions of the track surface. The sides of the passages are inclined toward the axis of symmetry of the track surface and the flat region in which they terminate are bounded on the axis of symmetry side by a smoothly curving surface forming the sidewall of one of the channels.

The air film produced by this configuration can be considered as a "control" flow volume of an essentially constant film thickness, bounded by the track surface on one side and the wafer surface on the other side. The control volume fluid generates forces acting on the wafer of a given weight, in directions normal to and in the plane of the wafer surface. These forces are a calculated result of the combined effects of the above mentioned axi-radial and Coanda flow phenomena.

Therefore it is an object of this invention to provide a new wafer transportation system.

A second object of the invention is to provide a wafer transportation system which minimizes movements of the wafer in the directions other than the desired direction of transportation.

It is a further object of the invention to provide a wafer transportation system which features simple low cost construction, ease of installation and maintainability, low air consumption, high insensitivity to clean air enclosures, clean operating environment and high overall reliability.

THE DRAWINGS

These and other objects of the invention will be apparent from the drawings of which:

Figure 1:
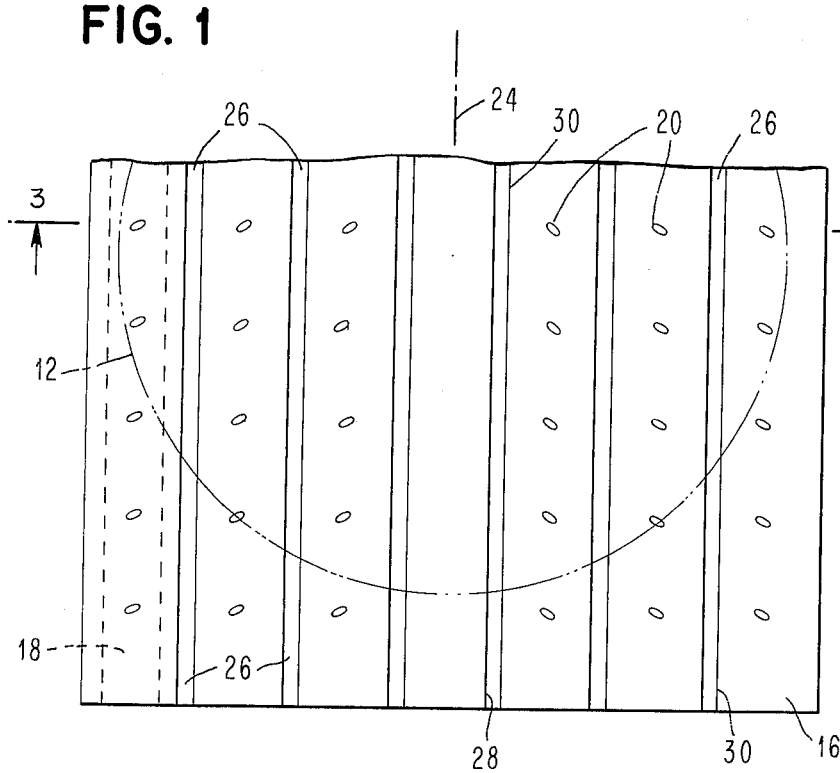
FIG. 1 is a plane view of a section of track for the wafer transportation system.
Figure 2:
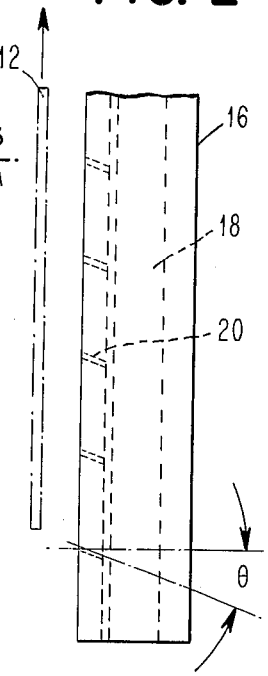
FIG. 2 is a side view of that same section of track.
Figure 3:
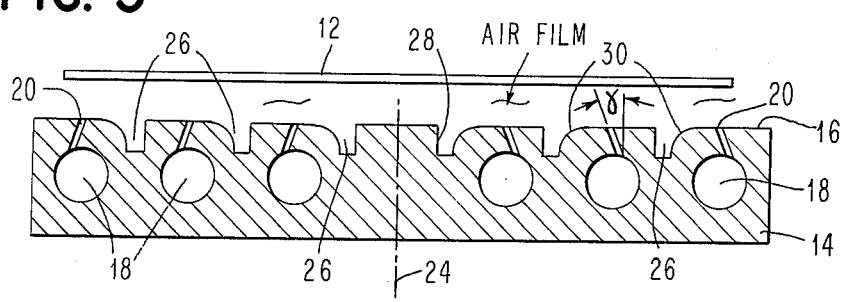
FIG. 3 is a sectional view taken along line 3—3 in FIG. 1.

Referring now to FIGS. 1 thru 3, a semiconductor wafer 12 is transported over a track 14 on an air film fed to the top surface 16 of the track from air manifolds 18 in the track 14 through nozzles with long thin passages 20 arranged in six rows positioned symmetrically around the center line 24 of the track 14. These passages are inclined with respect to the vertical at an angle $\gamma$ in the direction of the centerline and at an angle $\theta$ in the direction of motion along the track. An exhaust channel 26 is formed in the track 14 on the centerline side of each row of nozzles. These exhaust channels are asymmetrical in cross section in that the wall 28 towards the centerline is vertical and straight while the exterior wall 30 is curved with a radius R and terminates tangentially with the top surface 16 of the track.

The top surface of the track and the wafer are enclosed in a clear, plastic cover (not shown). This cover is to provide a barrier from dust and dirt and does not constitute a boundary for the movement of the wafers. In fact, if the track is properly configured and the air pressure properly adjusted, the wafers will not contact the shield. For instance, a silicon wafer $3\frac{3}{4}$ inches in diameter and 15 mils thick can be transported over a track of the type described with sufficient control of the wafer to eliminate the need of wafer guides when the track is constructed and operated to the specifications set forth in the following paragraph.

The film hole inclinations $\gamma°$ and $\theta°$ could be the same for all the film holes. This represents one constructional situation. If this were the case these angles, for example, would be: $\gamma = 15°$ and $\theta = 10°$. However, marked advantages in wafer motion control can be obtained by changing film hole angles $\gamma$ and $\beta$ for each opposing pair of film hole rows.

Figure 12:
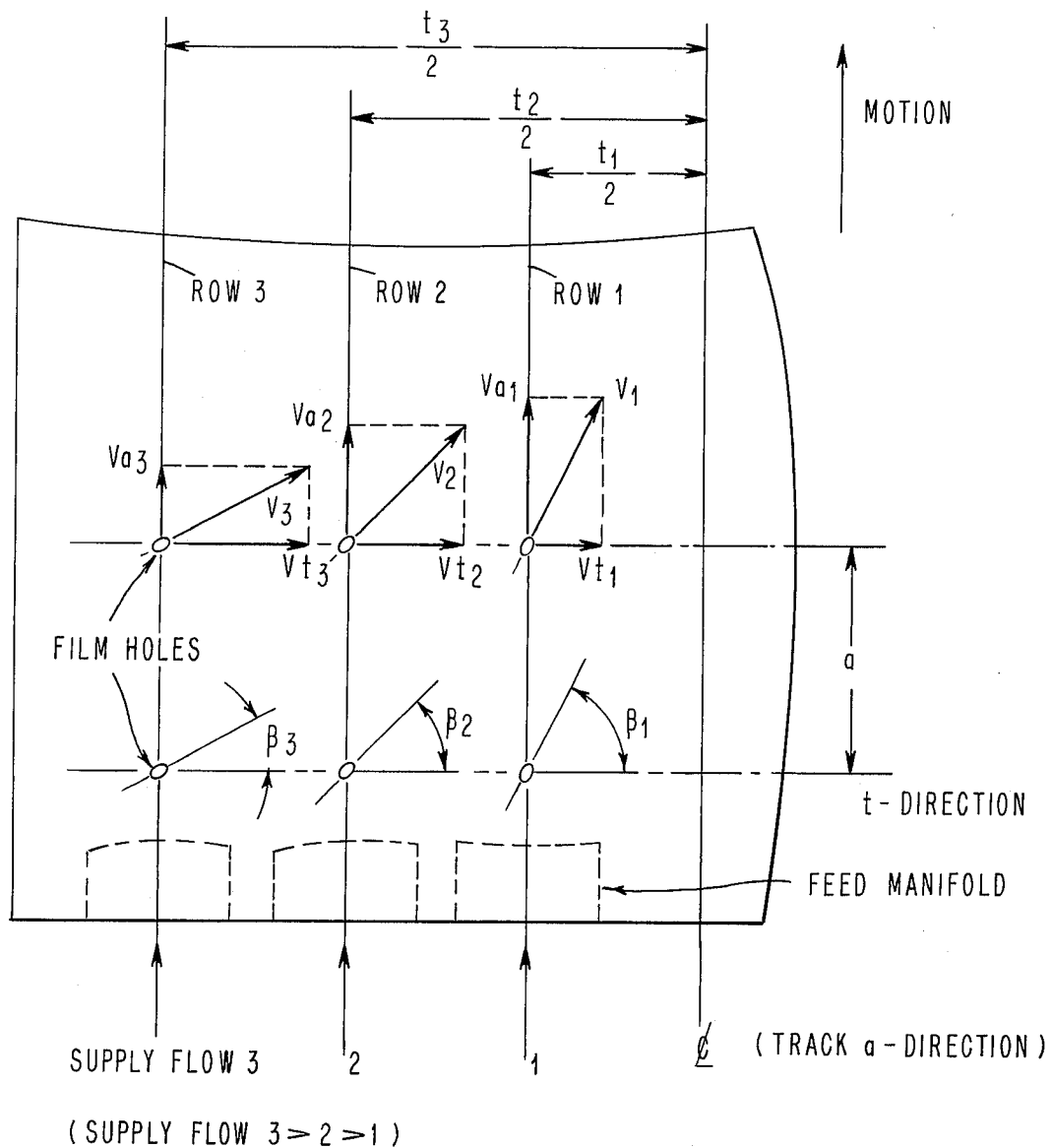
FIG. 12 is an enlarged view of a portion of the track shown in FIG. 1.

FIG. 12 shows three pairs of opposing film hole rows spaced at distances $t_1$, $t_2$ and $t_3$. The film hole spacing is denoted by "a". Each pair of film hole rows has a particular set of angles γ° and θ°. Thus, at row 1 the film hole angles γ and θ are such that planar velocity components $V_{al}$ and $V_{tl}$ exist and where $V_1$ is the planar resultant inclined at an angle $\beta_1$. Similarly, the γ, θ values for other rows are implemented so as to obtain the qualitative vector picture shown in FIG. 12. In addition to the angular difference, vectors $V_1$, $V_2$ and $V_3$ are different in magnitude because of the different supply flow rates in corresponding manifolds. Thus, $V_3 > V_2 > V_1$ reflect the supply flow rate variation, viz., flow rate 3 > flow rate 2 > flow rate 1.

The underlying reason for the film hole angular variations just described is to give a much improved transverse stability to the moving wafer. When the wafer C.G. is moving along the a-axis, the transverse velocity components $V_a$ dominate in producing fluid forces to propel the wafer. If the C.G. moves in the t-direction while the wafer moves down the track, the $V_a$ induced fluid forces diminish with deviation distance, t, while $V_t$ increases progressively to provide more effective transverse restoring force. The overall result is a stronger resistance to deviation from ₵ motion. Furthermore, when this condition does occur, the recovery (damping) is more rapid.

Typical film hole angles for the film hole rows are as follows:

row 1: γ = 10°, θ = 20° row 2: γ = 15°, θ = 15° row 3: γ = 20°, θ = 10°.

Film hole row spacings can vary somewhat without sensitive influence on wafer motion. For example, typical spacings for both 3¼ inch and 2¼ inch wafers are as follows:

$t_1$ = ⅞ inch to 1 inches $t_2$ = 2 inches to 2 1/16 inches $t_3$ = 2⅞ inch to 3 inches.

Also, typical film hole spacings, "a", range from ¾ inch to ⅞ inch.

Film hole diameters range from 0.0135 inch to 0.025 and lengths range from 0.065 inch to 0.12 inch. A typical track uses 0.0135 inch diameter film holes for lengths ranging from approximately 0.065 inch to 0.076 inch; the variation in lengths being due to the different inclination angles γ and θ.

Figure 5:
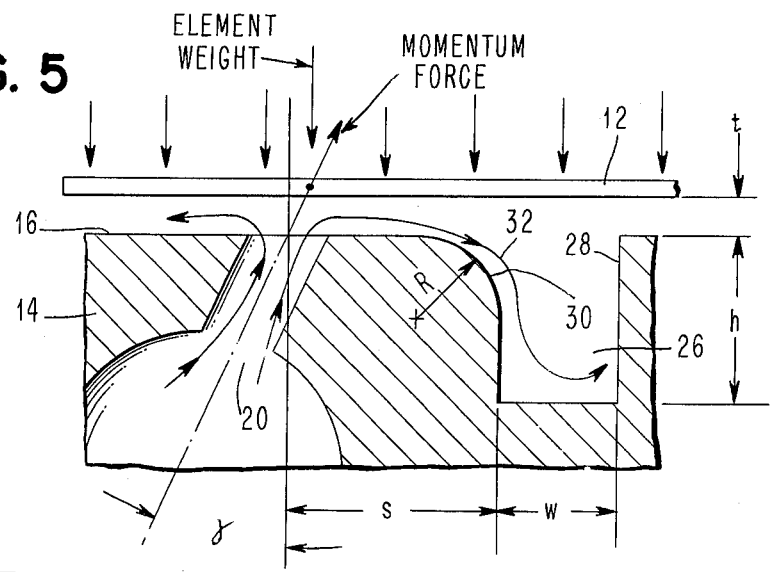
FIG. 5 is a section taken along line 5—5 in FIG. 4.

Referring to FIG. 5, the following typical dimensions are used in the track:

channel radius, r = 0.125 inch distance, s = 0.250 inch distance, h = 0.125 inch distance, w = 0.072 inch.

This set of dimensions represents one of a number of other practical conditions. For example, the channel radius, r, can be varied to augment transverse stability on the track. In other applications such as an orientor, or an intersection, the radius becomes less important because the axial wafer momentum force is absent. Indeed, a radius $r \approx o$ is used in our latest orientor designs.

Referring back to FIG. 12 the manifold supply flow rate is set by placing a manometer total pressure tube over film hole 20 and adjusting manifold pressure to give desired monometer readings. Thus, typical stagnation pressures for the film hole rows as measured by the manometer are as follows:

row 1: 6 to 10 inch water column
row 2: 15 to 20 inch water column
row 3: 28 to 34 inch water column.

The common reservoir for the manifold has pressure in the order of 1.5 to 2 psig upstream of the three adjustment valves for the film hole rows.

Figure 6:
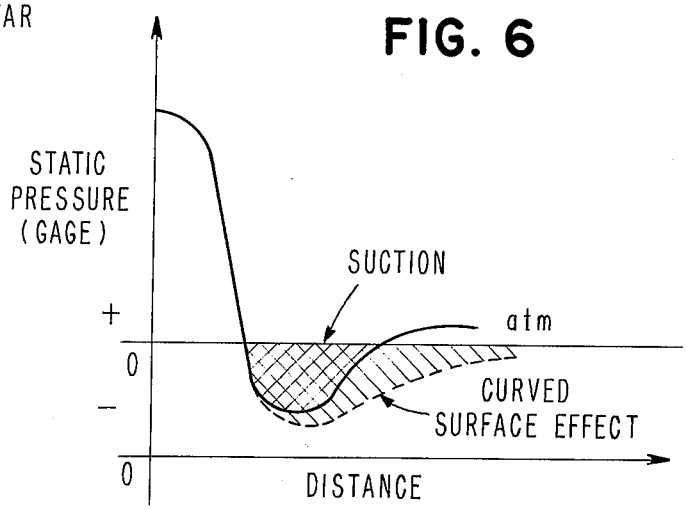
FIG. 6 is a plot of static pressure vs. distance from the center line of the passageway illustrated in FIG. 4.

Referring now to FIG. 5, air issuing from any one of the array of film holes 20 within the control volume strikes the wafer 12 and undergoes an abrupt change in flow direction. This change in direction results in a flow separation over the track surface which produces the static pressure variation in the radial direction which is shown in FIG. 6. The integrated effect of this variation, over a given surface area around the film hole, is both to attract and repel the wafer 12 by producing both an attracting and repelling force on the wafer. (One aspect of the curved surface 30 is that it acts to extend the attraction force over a wider region.)

The repelling force from the film hole acts to repel the wafer 12 from the track 14. This, however, is prevented by the coexisting attraction force and the weight of the wafer. The net result is that for a given air flow rate, a state of dynamic equilibrium occurs at a certain film thickness t, where the forces balance, in a direction normal to the track surface. The film thickness is characteristically constant and its value, for a given element weight, depends on the air flow rate. Any tendency of the element to tilt relative to the track surface is continuously counteracted.

Figure 7:
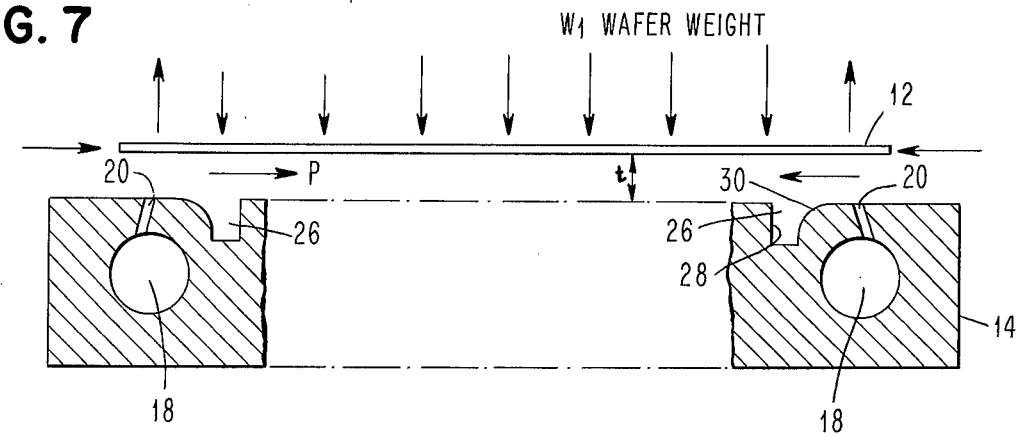
FIG. 7 is a more general view of FIG. 3 illustrating the forces exerted on the wafer in the normal direction.
Figure 8:
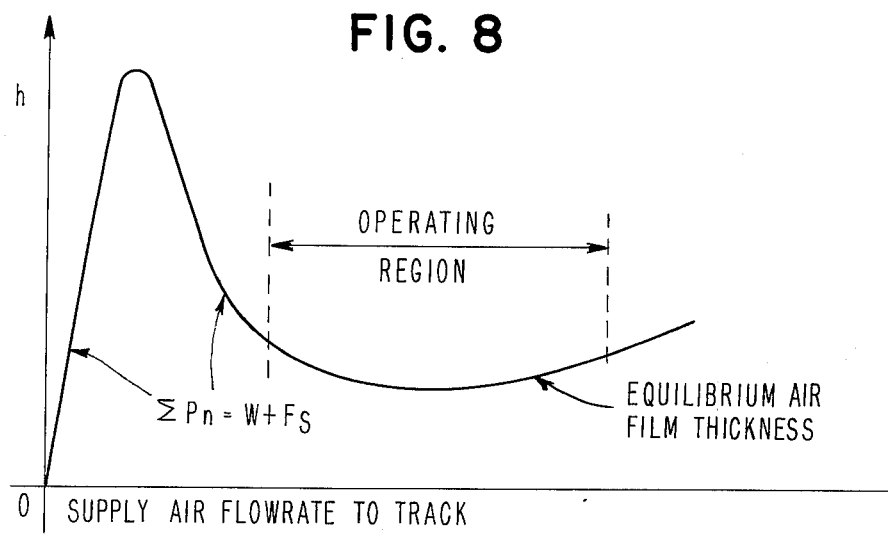
FIG. 8 is a graph of the height of the wafer over the track surface as a function of the air supply flow rate.

This analysis can be extended to the entire wafer surface bounding the upper side of the control volume. As shown in FIG. 7, the wafer 12 of weight w is subjected to an average force $F_s$ due to the combined suction effects of the film holes in the control volume or in other words, the air volume under the wafer. This force acts in the normal direction n and is opposed by the sum of normal momentum force components of the film hole flows, namely, $\Sigma P_n$. The dynamic equilibrium condition, at the film thickness h, is thus, $\Sigma P_n = W + F_s$. The control volume air film embodying this action of normal forces exerts a continuous, uniform, stabilizing effect on the wafer in the normal direction, n. Thus, as the wafer moves in the axial direction, a, it does so at an essentially constant film thickness, h, due to this overall motion constraint in the n-direction. The magnitude of the constant film thickness is, for other conditions fixed, a function of the air flow rate. This variation of h with track flow rate is illustrated in FIG. 8. Since the relationship $\Sigma P_n = W + F_s$ exists for each value of h, the shape of the curve reflects the relative magnitudes of the quantities $P_n$, W, and $F_s$. A variation in the wafer weight W, for example, is reflected by a shift to a new equilibrium value of h.

Up to this point the discussion has been focused on motion constraint properties in a direction normal to the air track and wafer surfaces. In addition to these properties, there coexist motion control forces in directions parallel to the wafer surface. The forces are incorporated into the air film by use of the Coanda effect in conjunction with the axi-radial phenomenon.

Figure 9:
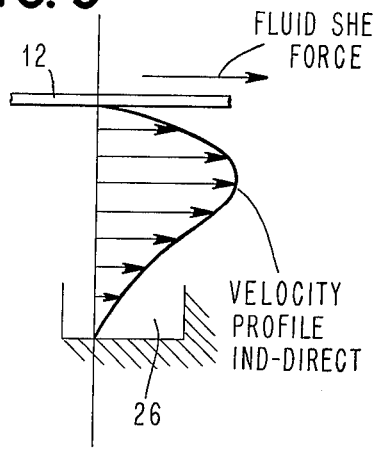
FIG. 9 is a plot of the fluid shear force.
Figure 4:
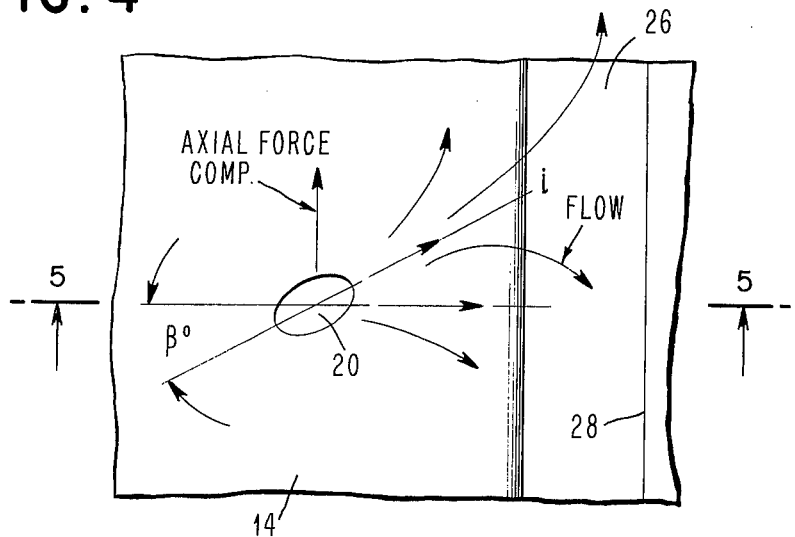
FIG. 4 is an expanded view of a portion of FIG. 1.

One kind of force in the plane of the wafer is due to the planar components of the momentum repelling force acting on the wafer element. These components are introduced by inclining the film holes (i.e., at angles $\gamma$ and $\theta$) so that planar components normal to, and parallel to, the track longitudinal axis are obtained. Thus, as shown in FIG. 4, this resolution consists of axial and transverse momentum force components on the wafer element, at each film hole site. The second kind of force in the plane of the wafer is due to the boundary layer induced frictional forces associated with the air flow parallel to the wafer surfaces. To illustrate this, a typical velocity profile is shown in FIG. 9. This profile represents the variation of the parallel flow velocity components with normal distance in the air film. In accordance with boundary layer theory, the flow shear force is proportional to the rate-of-change of this velocity, taken at the wafer surface. Hence, a fluid shear force is produced on the wafer element surface. The magnitude of this force, for other conditions equal, depends on the shape of the velocity profile in the neighborhood of the wafer surface (i.e., the greater the velocity rate-of-change, the higher the shear force). The channel action promotes a profile of the kind illustrated which, in turn, is very effective in the above process.

The combined effect of the above two kinds of forces is represented by the resultant planar force vector acting in the i-direction, as shown in FIG. 4. The constituent momentum and shear forces increase as the air flow rate is increased. For a given flow rate, the average velocity of the flow parallel to the wafer surface changes with distance from the film hole. Consequently, this is reflected in a corresponding variation of the shear force acting on the wafer surface. In the present case, the coupled action of the axi-radial suction region and the channel, produce a unique net effect with regard to the shear force characteristics. First, the flow separation over the suction region results in a high velocity parallel to the wafer surface. Second, the curved surface in "pulling" a large part of the efflux flow into the channel, enhances the velocity profile shape. Consequently, this coupled action results in a high, essentially constant shear force over the surface region encompassing the film hole and channel.

By referring back to FIG. 7 and 4, we can extend the above discussion to the entire wafer surface bounding the upper side of the control volume, the resultant planar force vector at a film hole is denoted by P, and its axial and transverse components by $P_a$ and $P_t$, respectively. As shown, each film hole row and its channel is opposed by an equal such arrangement located at the same distance and at the opposite side of the symmetry axis. In the illustrated track configuration, there are three pairs of symmetrically opposed film hole row — channel arrangements. Their spacing on the axis is essentially uniform with respect to the wafer diameter. The manifold pressure (i.e., film hole flow rate) is smallest for the innermost film hole rows and largest for the outermost rows. Correspondingly, the sum of the P forces for an innermost film hole row is smaller than that for the outermost row. Now, when the wafer center is on the axis of symmetry, the sum of the $P_t$ forces on one side of the symmetry axis is just balanced by the sum of $P_t$ on the opposite side. Denoting the sum of the $P_t$ forces acting on one half of the wafer surface by $R_t$, it is seen that $\Delta R_t = 0$ for the above symmetrical case. Now, if the wafer shifts in the transverse direction, an unbalanced situation in $R_t$ results due to two reasons. One, the wafer encounters increasingly higher $P_t$ forces in the transverse direction due to the manifold pressure settings discussed above. Two, more surface area of the wafer is exposed to the film hole effect in the shift direction. Consequently, an unbalanced force $\Delta R_t$ results which acts to return the wafer to the symmetry position.

Figure 10:
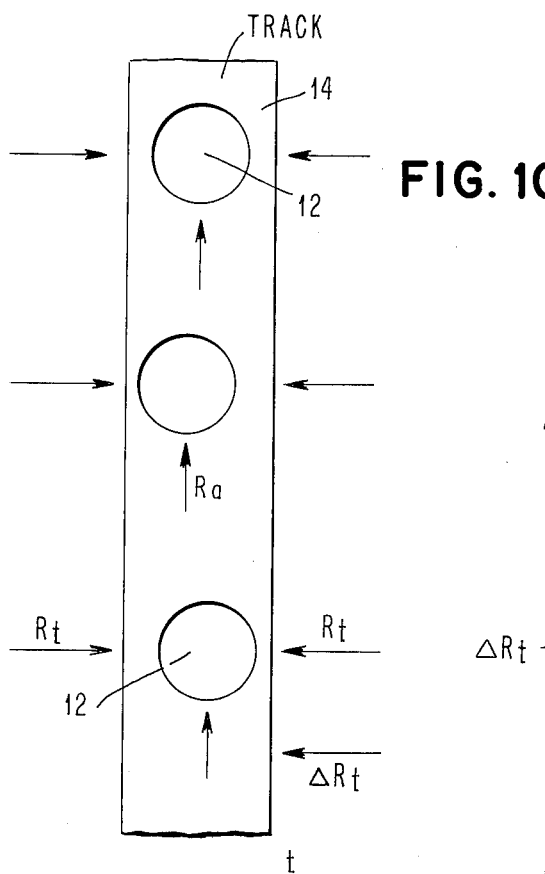
FIG. 10 is a schematic representation of forces acting on the wafers as they move along the track.
Figure 11:
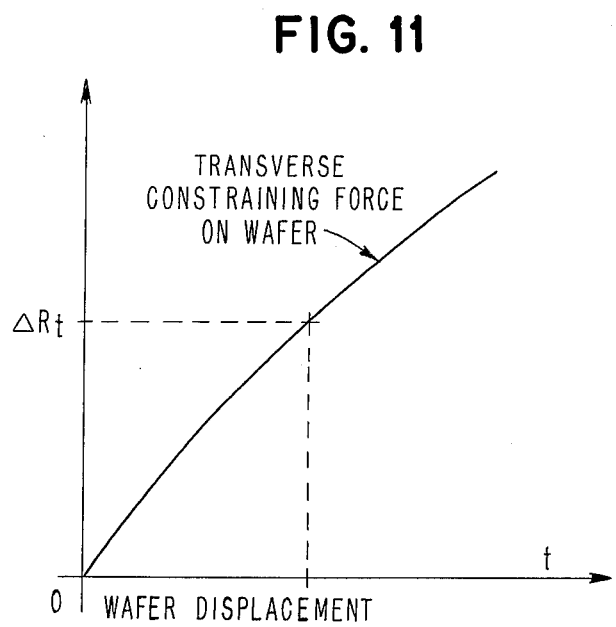
FIG. 11 is a plot of transverse restraining force on wafers.

The action of the $R_t$ transverse constraining force is illustrated in FIG. 10. As shown, the wafer moving axially along the track is continuously subjected to the centering $R_t$ force field. Any tendency for the wafer to travel in the transverse direction produces a $\Delta R_t$ force that acts to bring its c.g. on the symmetry axis as it moves in the axial direction. The variation of $\Delta R_t$ with wafer displacement in the transverse direction is sketched in the figure. Once an axially moving wafer is displaced transversely, it is desirable to restore its motion back to the symmetry axis, in the shortest possible downstream axial distance. The characteristics of the $\Delta R_t$ field are very effective in accomplishing this action.

Referring again to FIG. 10 the sum of the axial force components $P_a$ is denoted by $R_a$. This unbalanced force scheme moves the wafer on the air film along the axis of symmetry. Another scheme is discussed below in connection with motion control techniques.

The above air film embodies unique characteristics of concurrently acting normal-direction and planar forces acting on a moving wafer. It is thus capable of exerting multidirectional constraint on a wafer moving in a prescribed manner. For linear wafer motion, the force field constrains its transverse and normal direction motions in a stable manner. For rotational motion, in a variation of the film surface shown in FIG. 2, the force field acts radially and normally to provide precise, stable rotation with respect to the symmetry axes of the surface. The generic air film surface can take different forms depending on the application and/or emphasis on certain control properties (e.g., air tracks, intersections, orientors).

By this basic configuration, a unique air film is generated having multidirectional wafer motion control properties. This film surface, based on a synthesis of two fluid mechanics phenomena, can take various forms depending on the application. The key feature of its operation resides in the effective coupling of the axi-radial and Coanda flow characteristics. The fundamental surface construction feature by which this is accomplished is illustrated, in essence, by flat surface regions containing long, thin air film holes interrupted by channels having a certain cross-sectional shape. Among the important geometric quantities are included the film hole diameter, length, and inclination; the extent of the flat surfaces containing the film holes; the dimensions of the channel cross-section; and, the spacing arrangements of the film hole rows and channels with respect to the wafer surface. Some of the fluid mechanics parameters include air flow rate supply and distribution to various film hole regions.

Therefore it should be obvious to those skilled in the art that many changes can be made in the above embodiment of the invention without departing from the spirit and scope of the invention.

What is claimed is:

1. A method of controlling the motion of objects such as semiconductor wafers along a surface of an elongated track on a bed of air comprising:
   emitting air against one side of the object from a plurality of rows of jets positioned longitudinally along the track with openings in the surface of the track and passages to the surface which are at least four times longer than the diameter of the openings and which are inclined towards each other in opposing pairs made up of jets from different rows to define the path of travel for the objects positioned over the jets; and evacuating air introduced by each row of jets from the surface of the track over the side of a channel extending longitudinally along the track in the surface of that track which side is spaced alongside the row in the direction of inclination of the passages of the jets and which side is curved to cause a Coanda effect.

2. The method of claim 1 including setting the pressure of the air emitted by the jets at an equilibrium level that suspends the objects on a thin bed of air.

3. A track for transporting objects such as semiconductor wafers on a bed of air comprising:

a substantially elongated transporting track having rows of holes in it that extend longitudinally along the track and are separated from adjacent rows by channels also extending longitudinally along the track, the holes being the output ends of passages that are at least four times as long as the holes are wide and are inclined toward each other in opposing pairs made up of jets from different rows and the channels having curved side walls on the sides towards which the passages are inclined; and a gaseous fluid supply means coupled to the input ends of the passages for directing gaseous fluid through said passages to the transporting surface to be directed against the facing surface of the transporting objects and then over the curved side walls of the channels to form a thin layer of gaseous fluid for holding the objects suspended above the track.

4. The track of claim 3 wherein the passages are inclined both towards the centerline of the track and in the direction of desired transportation down the track to provide both motion and stabilizing forces to the transporting objects.

5. The track of claim 4 wherein there are a plurality of rows and passages on each side of the centerline.

6. The track of claim 5 wherein the inclination of the passages in the direction of the centerline is less in any given row of passages than it is in a row of passages which is further from the centerline of the track.

7. The track of claim 6 wherein the inclination of the passage in the direction of transportation is greater in any given row of passages than it is in a row of passages further from the centerline of the track.

8. The track of claim 7 wherein there are three rows of passages on each side of the track.

9. The track of claim 5 wherein the air supply means is for supplying gaseous liquid under greater pressure to any given row of passages than is supplied to a row of passages that is closer to the centerline of the track.

* * * * *